(12) United States Patent
Kim

(10) Patent No.: US 9,722,579 B1
(45) Date of Patent: Aug. 1, 2017

(54) SEMICONDUCTOR DEVICE

(71) Applicant: SK hynix Inc., Gyeonggi-do (KR)

(72) Inventor: Jae-Heon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/990,484

(22) Filed: Jan. 7, 2016

(51) Int. Cl.
    H03K 17/00     (2006.01)
    H03K 3/01      (2006.01)
    H03K 3/356     (2006.01)

(52) U.S. Cl.
    CPC ......... H03K 3/01 (2013.01); H03K 3/356113 (2013.01)

(58) Field of Classification Search
    USPC ............... 327/111–112; 326/82–83, 86–87
    See application file for complete search history.

(56) References Cited

U.S. PATENT DOCUMENTS

| 6,157,204 A * | 12/2000 | Sher ............... H03K 17/163 326/17 |
| 8,081,150 B2* | 12/2011 | An ................ G09G 3/3688 330/257 |
| 8,896,354 B1* | 11/2014 | Hong ............. H03K 19/00 327/108 |
| 2008/0143423 A1* | 6/2008 | Komatsu ....... H01L 21/823878 327/534 |

FOREIGN PATENT DOCUMENTS

KR  1020140086675  7/2014
KR  1020140146330  12/2014

* cited by examiner

*Primary Examiner* — An Luu
(74) *Attorney, Agent, or Firm* — IP & T Group LLP

(57) ABSTRACT

A semiconductor device may include: a pre-driving unit suitable for transmitting input data to a first node in response to a first control signal; a main driving unit suitable for outputting the input data transmitted to the first node, using a first voltage as a driving voltage; and a bias control unit suitable for supplying a second voltage to the first node in response to a second control signal, the second voltage having a different level from the first voltage.

19 Claims, 2 Drawing Sheets

US 9,722,579 B1

SEMICONDUCTOR DEVICE

BACKGROUND

1. Field

The present invention relates generally to a semiconductor technology, and more particularly to a semiconductor device which performs a data output operation.

2. Description of the Related Art

Semiconductor devices have been gradually improving in terms of speed, integration, and power consumption. Generally, in order to achieve higher speed and lower power consumption, various elements employed in a semiconductor device must be typically operated at a low voltage. However, when general elements which are not designed to operate at a low voltage are employed in a semiconductor device, the semiconductor device may not be normally operated under low-voltage. Furthermore, even in elements which are designed to operate at a low voltage, a leakage current may occur. For example, a general transistor having a high threshold voltage may not operate in response to a low voltage. Also, even if a low-voltage transistor having a low threshold voltage is used, a leakage current may be increased at low voltage.

SUMMARY

Various embodiments of the invention are directed to a semiconductor device capable of reducing a leakage current of a main driving unit during a standby mode of the semiconductor device operating at a low voltage.

In an embodiment, a semiconductor device may include: a pre-driving unit suitable for transmitting input data to a first node in response to a first control signal; a main driving unit suitable for outputting the input data transmitted to the first node, using a first voltage as a driving voltage; and a bias control unit suitable for supplying a second voltage to the first node in response to a second control signal, the second voltage having a different level from the first voltage.

The second control signal may be activated during a standby mode of the semiconductor device operating at a low voltage.

The pre-driving unit may float the first node when the first control signal is deactivated.

The bias control unit may further include a bulk voltage control unit suitable for controlling a bulk voltage terminal of the pre-driving unit to be supplied with a third voltage in response to the second control signal, during the standby mode of the semiconductor device, the third voltage having a different level from the first voltage.

The second and third voltages may have the same voltage level.

The bias control unit may supply the first voltage to the first node and the bulk voltage terminal in response to the second control signal during an active mode.

The first voltage may comprise an external supply voltage, and the second voltage has a higher level than the external supply voltage.

The first voltage may comprise an external ground voltage, and the second voltage has a lower level than the external ground voltage.

In the other embodiment, a semiconductor device may include: a pre-driving unit suitable for transmitting input data to first and second nodes in response to a first control signal; a main driving unit suitable for outputting the input data transmitted to the first and second nodes, using first and second voltages as driving voltages; and a bias control unit suitable for supplying a third voltage having a higher level than the first voltage to the first node and a first bulk voltage terminal of the pre-driving unit and for supplying a fourth voltage having a lower level than the second voltage to the second node and a second bulk voltage terminal of the pre-driving unit, respectively, in response to a second control signal.

The second control signal may be activated during a standby mode of the semiconductor device operating at a low voltage.

The pre-driving unit may float the first and second nodes when the first control signal is deactivated.

The pre-driving unit may include: a pull-up pre-driving unit suitable for transmitting the input data to the first node in response to the first control signal; and a pull-down pre-driving unit suitable for transmitting the input data to the second node in response to the first control signal.

The main driving unit may include: a pull-up main driving unit suitable for outputting the input data transmitted to the first node, using the first voltage as a driving voltage; and a pull-down main driving unit suitable for outputting the input data transmitted to the second node, using the second voltage as a driving voltage.

The bias control unit may include: a pull-up bias control unit suitable for supplying the third voltage to the first node and the first bulk voltage terminal serving as a bulk voltage terminal of the pull-up pre-driving unit in response to the second control signal; and a pull-down bias control unit suitable for supplying the fourth voltage to the second node and the second bulk voltage terminal serving as a bulk voltage terminal of the pull-down pre-driving unit in response to the second control signal.

Each of the pull-up and pull-down bias control units may comprise a plurality of current mirror-type MOS transistors suitable for receiving the third voltage as a supply voltage, receiving the fourth voltage as a ground voltage, and receiving a standby control signal through a common gate terminal thereof.

The pull-up bias control unit may supply the first voltage to the first bulk voltage terminal and the first node during an active mode.

The pull-down bias control unit may supply the second voltage to the second bulk voltage terminal and the second node during an active mode.

The first voltage may comprise an external supply voltage, and the third voltage has a voltage level higher than the external supply voltage.

The second voltage may comprise an external ground voltage, and the fourth voltage has a voltage level lower than the external ground voltage.

In the other embodiment, a semiconductor device may include: a main driving unit suitable for outputting input data; and a semiconductor bias controller suitable for transmitting the input data to the main driving unit during an active mode and reducing or preventing a leakage current of the main driving unit during a standby mode that the semiconductor device operates at a low voltage.

DETAILED DESCRIPTION

Figure 1:
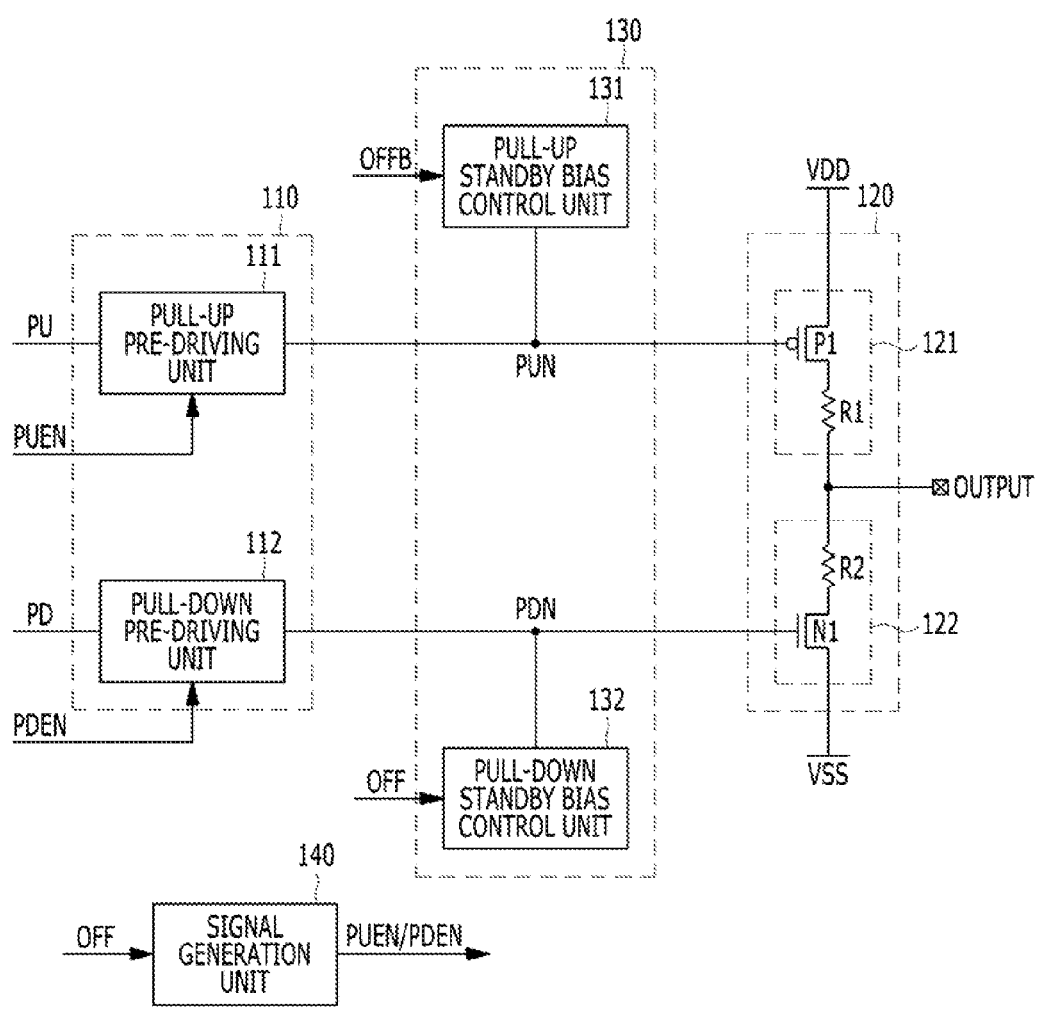
FIG. 1 is a configuration diagram of a semiconductor device, according to an embodiment of the invention.

Various embodiments of the invention will be described below in more detail with reference to the accompanying drawings. The present invention may, however, be embodied in different forms and should not be construed as limited to the embodiments set forth herein. Rather, these embodiments are provided so that this disclosure will be thorough and complete. Throughout the disclosure, like reference numerals refer to like parts throughout the various figures and embodiments of the present invention.

FIG. 1 is a configuration diagram of a semiconductor device according to an embodiment of the present invention.

Referring to FIG. 1, the semiconductor device may include a pre-driving unit 110, a main driving unit 120, and a bias control unit 130.

The pre-driving unit 110 may include a pull-up pre-driving unit 111 and a pull-down pre-driving unit 112. The pull-up pre-driving unit 111 may output input data PU to a first node PUN in response to a control signal PUEN. The pull-down pre-driving unit 112 may output input data PD to a second node PDN in response to a control signal PDEN. The input data PU and PD may be the same data.

Data inputted to the pull-up pre-driving unit 111 will also be referred to as the pull-up data PU, while data inputted to the pull-down pre-driving unit 112 will also be referred to as the pull-down data PD. Control signal PUEN and PDEN may be the same signals. A control signal inputted to the pull-up pre-driving unit 211 will also be referred to as a pull-up control signal PUEN, while a control signal inputted to the pull-down pre-driving unit 212 will also be referred to as a pull-down control signal PDEN.

The pre-driving unit 110 may float the first and second nodes PUN and PDN when the control signals PUEN and PDEN are deactivated. In other words, the pre-driving unit 110 may not be driven when the control signals PUEN and PDEN are deactivated. Thus, the first and second nodes PUN and PDN may be floated. The first control signal PUEN may be deactivated in response to a control signal OFFB. The control signal PDEN may be deactivated in response to a control signal OFF. The control signals OFFB, OFF may be activated when an active mode is disabled, for example, during a standby mode of the semiconductor device operating at a low voltage. The control signal OFFB may be inputted to a pull-up standby bias control unit 131. The control signal OFF may be inputted to a pull-down standby bias control unit 132. Control signals PUEN, or PDEN will also be referred to as a first control signal, while control signals OFFB or OFF will also be referred to as a second control signal.

The main driving unit 120 may include a pull-up main driving unit 121. The main driving unit 120 may include a pull-down main driving unit 122. The pull-up main driving unit may output the input data PU transmitted to the first node PUN using a supply voltage VDD as a driving voltage. The pull-down main driving unit may output the input data PD transmitted to the second node PDN, using a ground voltage VSS as a driving voltage. The supply voltage VDD or the ground voltage VSS will also be referred to herein as a first voltage. The supply and/or ground voltage VDD, VSS may be external.

The pull-up main driving unit 121 may include a PMOS transistor P1 serving as a pull-up driving element. The pull-up main driving unit 121 may include a first resistor R1 serving as a resistance element. The pull-down main driving unit 122 may include an NMOS transistor N1 serving as a pull-down driving element. The pull-down main driving unit 122 may include a second resistor R2 serving as a resistance element. The PMOS transistor P1 may be coupled between the supply voltage VDD and the first resistor R1 and receive the input data PU transmitted to the first node PUN through its gate terminal. The NMOS transistor N1 may be coupled between the second resistor R2 and the ground voltage VSS and receive the pull-down data PD transmitted to the second node PDN through its gate terminal.

The bias control unit 130 may supply a second voltage having a different level from the first voltage (i.e. either the supply voltage VDD or the ground voltage VSS) to the first and second nodes PUN and PDN in response to second control signals OFFB, OFF. The first voltage may include the supply voltage VDD or the ground voltage VSS according to a pull-up or a pull-down operation of the semiconductor device. The second voltage may include a voltage having a voltage level higher than the external supply voltage VDD or a voltage level lower than the external ground voltage VSS according to a pull-up operation or a pull-down operation. The second control signals OFFB and OFF may be completely out-of phase with each other. A control signal inputted to a pull-up standby bias control unit 131 will be referred to as a pull-up second control signal OFFB, and a control signal inputted to a pull-down standby bias control unit 132 will be referred to as a pull-down second control signal OFF. The second control signals OFFB and OFF may include mode signals generated externally or internally.

The bias control unit 130 may include a pull-up standby bias control unit 131 and a pull-down standby bias control unit 132.

The pull-up standby bias control unit 131 may supply a second voltage to the first node PUN in response to the pull-up second control signal OFFB, the second voltage of the first node PUN having a higher level than the first voltage serving as the external supply voltage VDD. The pull-down standby bias control unit 132 may supply the second voltage to the second node PDN in response to the pull-down second control signal OFF, the second voltage of the second node PDN having a lower level than the first voltage serving as the external ground voltage VSS.

The pull-up standby bias control unit 131 may include a bulk voltage control unit (not shown) for supplying the second voltage to a bulk voltage terminal of the pull-up pre-driving unit 111 in response to the pull-up second control signal OFFB. The pull-down standby bias control unit 132 may include a bulk voltage control unit (not shown) for supplying the second voltage to a bulk voltage terminal of the pull-down pre-driving unit 112 in response to the pull-down second control signal OFF.

The pull-up standby bias control unit 131 may supply a first voltage corresponding to the external supply voltage VDD to the first node PUN during an active mode, and may also supply the bulk voltage of the pull-up pre-driving unit 111 as the first voltage corresponding to the external supply voltage VDD. The pull-down standby bias control unit 132 may supply a first voltage corresponding to the external ground voltage VSS to the second node PDN during the active mode, and may also supply the bulk voltage of the pull-down pre-driving unit 112 as the first voltage corresponding to the external ground voltage VSS.

The semiconductor device may include a signal generation unit 140. The signal generation unit 140 may deactivate a first control signal PUEN/PDEN in response to a second control signal OFF for enabling the standby mode when the active mode is disabled. In the embodiment of the present invention, a first control signal PUEN/PDEN may be deactivated in response to a second control signal OFF. However, the first control signal PUEN/PDEN may be activated in response to a signal for enabling the active mode.

Hereafter, a pull-up operation of the semiconductor device according to an embodiment of the present invention will be described. First, during an active mode, the pull-up pre-driving unit 111 may output the pull-up data PU to the first node PUN in response to the pull-up first control signal PUEN, and the pull-up main driving unit 121 may output the input data PU transmitted to the first node PUN to an output terminal OUTPUT, using the first voltage corresponding to the external supply voltage VDD as a driving voltage.

Then, during a standby mode, the pull-up pre-driving unit 111 may be disabled in response to the deactivated pull-up control signal PUEN. Thus, the first node PUN may be floated. The pull-up standby bias control unit 131 may supply the second voltage to the first node PUN in response to the pull-up second control signal OFFB, the second voltage of the first node PUN having a voltage level higher than the first voltage corresponding to the external supply voltage VDD. Thus, the pull-up main driving unit 121 may reduce or prevent a leakage current because its gate voltage becomes higher than its source voltage.

Furthermore, during the standby mode, the pull-up bias control unit 131 may supply a second voltage to the bulk voltage terminal of the pull-up pre-driving unit 111, the second voltage of the bulk voltage terminal having a voltage level higher than the first voltage corresponding to the external supply voltage VDD. This may indicate that a high voltage is supplied to the first node PUN serving as an output node of the pull-up pre-driving unit 111, under the control of the pull-up bias control unit 131. When the bulk voltage of a bulk transistor (not shown) of the pull-up pre-driving unit 111 has a level corresponding to the external supply voltage VDD, the source and drain of the bulk transistor may be reversed to cause a malfunction in which the bulk transistor which needs to maintain a turn-off state is turned on. Thus, the bulk voltage of the pull-up pre-driving unit 111 may also be controlled to have the second voltage higher than the first voltage, thereby preventing a situation in which the transistor of the pull-up pre-driving unit 111 is turned on.

During the standby mode, the bias control unit 130 may supply the second voltage to the first or second node PUN or PDN serving as the output node of the pre-driving unit 110 to reduce or prevent a leakage current of the main driving unit 120. The second voltage may be higher or lower than the first voltage employed during the active mode. Furthermore, during the standby mode, the bulk voltage of the pre-driving unit 110 may be controlled to have the same level as the voltage levels supplied to the first and second nodes PUN and PDN, thereby preventing a situation in which the transistor which has been floated and turned off is turned on.

The pull-down pre-driving unit 112, the pull-down main driving unit 121, and the pull-down standby bias control unit 131 can be operated in the opposite manner to the pull-up operation, the detailed descriptions thereof are omitted herein.

Figure 2:
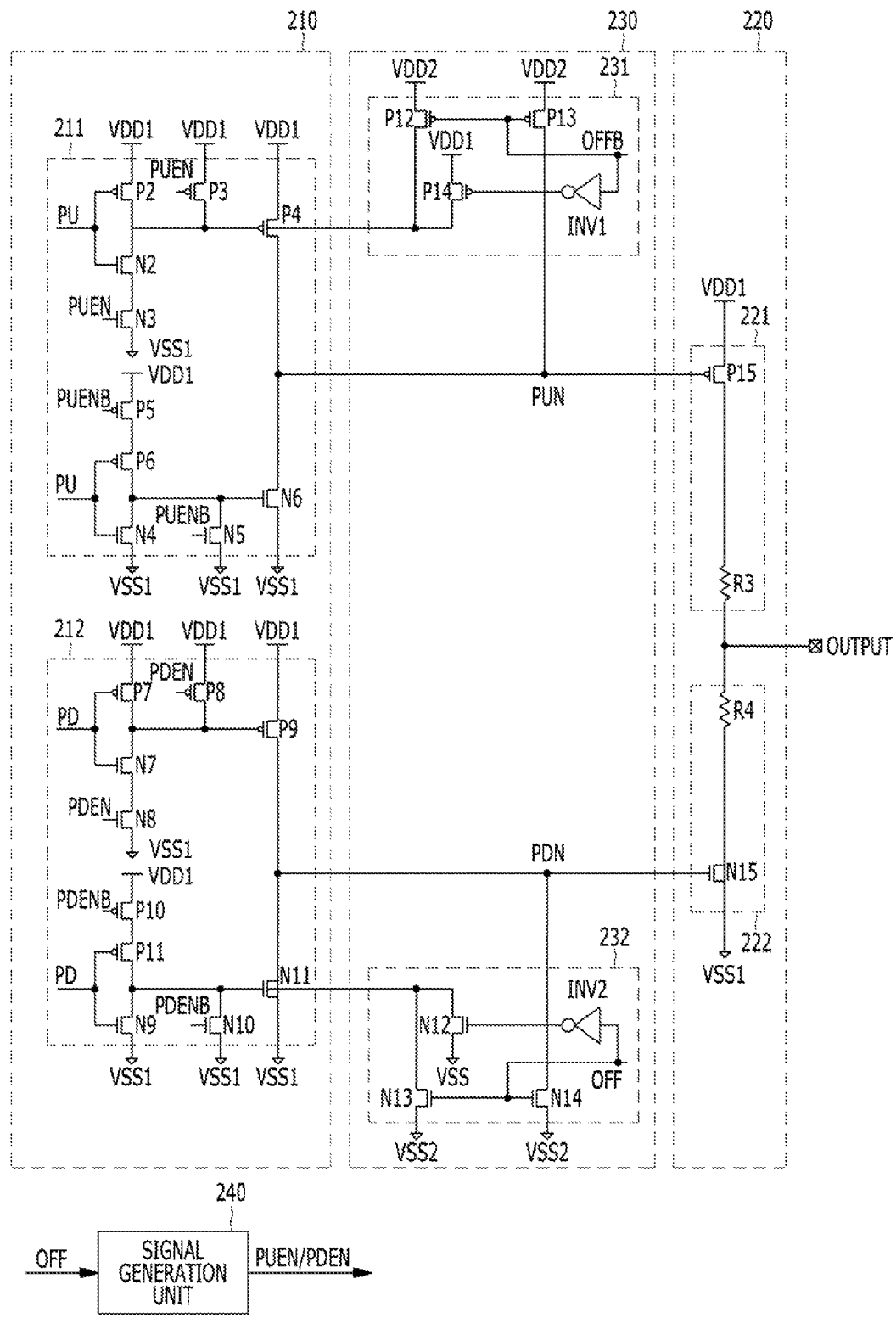
FIG. 2 is a circuit diagram of a semiconductor device, according to another embodiment of the present invention.

FIG. 2 is a circuit diagram of a semiconductor device according to another embodiment of the present invention.

Referring to FIG. 2, the semiconductor device may include a pre-driving unit 210, a main driving unit 220, and a bias control unit 230.

The pre-driving unit 210 may output input data PU to first node PUN in response to a control signal PUEN and input data PD to a second node PDN in response to a control signal PDEN. Control signal PUEN or PDEN will also be referred to as first control signal PUEN or PDEN. The input data PU and PD may be the same data. Hereafter, data inputted to the pull-up pre-driving unit 211 will be referred to as pull-up data PU, and data inputted to the pull-down pre-driving unit 212 will be referred to as pull-down data PD. The pre-driving unit 210 may be disabled when the first control signal PUEN/PDEN is deactivated. Thus, the first and second nodes PUN and PDN may be floated. The first control signal PUEN may be deactivated in response to a control signal OFFB and the first control signal PDEN may be deactivated in response to a control signal OFF which will be described below. Control signal OFFB or OFF will also be referred to as second control signal OFFB or OFF. First control signals PUEN and PDEN may be the same signal. Hereafter, a control signal inputted to a pull-up pre-driving unit 211 will be referred to as the pull-up control signal PUEN, and a control signal inputted to a pull-down pre-driving unit 212 will be referred to as the pull-down control signal PDEN. The second control signal OFFB/OFF may be activated when an active mode is disabled, that is, during a standby mode of the semiconductor device operating at a low voltage.

The pre-driving unit 210 may include the pull-up pre-driving unit 211 and the pull-down pre-driving unit 212. The pull-up pre-driving unit 211 may output the pull-up data PU to the first node PUN in response to the pull-up first control signal PUEN. The pull-down pre-driving unit 212 may output the pull-down data PD to the second node PDN in response to the pull-down first control signal PDEN.

The pull-up pre-driving unit 211 may include a plurality of PMOS transistors P2 to P6 and a plurality of NMOS transistors N2 to N6. The PMOS transistor P2 and the NMOS transistor N2 may be coupled in series between a first supply voltage VDD1 and the NMOS transistor N3, and receive the pull-up data PU through their common gate terminals. The PMOS transistor P6 and the NMOS transistor N4 may also be coupled in series between the PMOS transistor P5 and a first ground voltage VSS1, and receive the pull-up data PU through their common gate terminal. The NMOS transistor N3 may be coupled between the NMOS transistor N2 and the first ground voltage VSS1 and receive the pull-up enable signal PUEN through its gate terminal, and the PMOS transistor P5 may be coupled between the first supply voltage VDD1 and the PMOS transistor P6 and receive the inverted pull-up enable signal PUENB through its gate terminal. The PMOS transistor P3 may have a source terminal coupled to the first supply voltage VDD1, a drain terminal coupled between the PMOS transistor P2 and the NMOS transistor N2, and a gate terminal configured to receive the pull-up enable signal PUEN. The NMOS transistor N5 may have a source terminal coupled between the PMOS transistor P6 and the NMOS transistor N4, a drain terminal coupled to the first ground voltage VSS1, and a gate terminal configured to receive the inverted pull-up enable signal PUENB. The PMOS transistor P4 and the NMOS transistor N6 may be coupled in series between the first supply voltage VDD1 and the first ground voltage VSS1, and the PMOS transistor P4 may receive a bulk voltage through its bulk terminal. The PMOS transistor P4 and the NMOS transistor N6 may output the pull-up data PU to the first node PUN through its common drain terminal.

The pull-up pre-driving unit 211 may control the pull-up data PU to have a low or high level according to the level value of the pull-up data PU transmitted to the first node PUN, in response to the pull-up control signal PUEN. Furthermore, when the pull-up enable signal PUEN is deactivated, the PMOS transistor P3 of the pull-up pre-driving unit 211 may be turned off. Thus, the output node of the pull-up pre-driving unit 211, that is, the first node PUN may be floated.

Since the pull-down pre-driving unit 212 has the same configuration as the pull-up pre-driving unit 211 and operates in the opposite manner to the pull-up pre-driving unit 211, the detailed descriptions for its configuration and operation are omitted herein.

The main driving unit 220 may include a pull-up main driving unit 221 outputting the pull-up data PU transmitted to the first node PUN using the first supply voltage VDD1 as a driving voltage and a pull-down main driving unit 222 outputting the pull-down data PD transmitted to the second node PDN, using the first ground voltage VSS1 as a driving voltage.

The pull-up main driving unit 221 may include a PMOS transistor P15 serving as a pull-up driving element and a third resistor R3 serving as a resistance element. The pull-down main driving unit 222 may include an NMOS transistor N15 serving as a pull-down driving element and a fourth resistor R4 serving as a resistance element. The PMOS transistor P15 may be coupled between the first supply voltage VDD1 and the third resistor R3 and receive the pull-up data PU transmitted to the first node PUN through its gate terminal, and the NMOS transistor N15 may be coupled between the fourth resistor R4 and the first ground voltage VSS1 and receive the pull-down data PD transmitted to the second node PDN through its gate terminal.

The bias control unit 230 may be configured in a current mirror type, and supply a second supply voltage VDD2 to the first node PUN in response to the control signal OFFB and a second ground voltage VSS2 to the second node PDN in response to the control signal OFF. The first and second control signals OFFB and OFF may be coupled to the bulk voltage of the pre-driving unit 210 and the gate terminal of the main driving unit 220. The second supply voltage VDD2 may have a voltage level higher than the first supply voltage VDD1. The second ground voltage VSS2 may have a voltage level lower than the first ground voltage VSS1. The control signals OFFB/OFF, also referred to herein as second control signal OFFB or OFF, may be completely out of phase with each other. Hereafter, a control signal inputted to a pull-up bias control unit 231 will be referred to as the pull-up second control signal OFFB, and a control signal inputted to a pull-down bias control unit 232 will be referred to as the pull-down second control signal OFF. The second control signals OFFB and OFF may include mode signals generated externally or internally.

The bias control unit 230 may include the pull-up bias control unit 231 and the pull-down bias control unit 232.

The pull-up bias control unit 231 may include a plurality of PMOS transistors P12 to P14 and a first inverter INV1, and the pull-down bias control unit 232 may include a plurality of NMOS transistors N12 to N14 and a second inverter INV2.

The PMOS transistors P12 and P13 may be coupled in a current mirror type, and receive the pull-up standby control signal OFFB through its common gate terminal, using the first supply voltage VDD1 as a supply voltage. The PMOS transistor P12 may be coupled to a bulk voltage node, and the PMOS transistor P13 may be coupled to the first node PUN. The PMOS transistor P14 may be coupled between the first supply voltage VDD1 and the bulk voltage node, and receive the inverted signal of the pull-up standby control signal OFFB through its gate terminal.

The pull-up bias control unit 231 may supply the second supply voltage VDD2 to the first node PUN and the bulk voltage node of the pull-up pre-driving unit 211 in response to the pull-up second control signal OFFB, and reduce or prevent a leakage current which may occur in the pull-up main driving unit 221 during the standby mode of the semiconductor device operating at a low voltage. Furthermore, the pull-up bias control unit 231 may prevent a situation in which the PMOS transistor P4 which has been floated and turned off by the pull-up first control signal PUEN is turned on. Thus, the second supply voltage VDD2 obtained by adding the first supply voltage VDD1 and a threshold voltage Vth of the PMOS transistor P4 may have a higher level than the first supply voltage VDD1.

The pull-down bias control unit 232 may include NMOS transistors N12 to N14, unlike the pull-up bias control unit 231. Thus, the pull-down bias control unit 232 may operate in the opposite manner to the pull-up bias control unit 231. Thus, the detailed descriptions of the operation of the pull-down bias control unit 232 are omitted herein.

The semiconductor device according to an embodiment of the invention may include a signal generation unit 240. The signal generation unit 240 may deactivate the first control signal PUEN/PDEN in response to the second control signal OFF for enabling the standby mode when the active mode is disabled. In the embodiment of the present invention, the first control signal PUEN/PDEN may be deactivated in response to the second control signal OFF. However, the first control signal PUEN/PDEN may be activated in response to a signal for enabling the active mode.

Hereafter, the pull-up operation of the semiconductor device according to an embodiment of the invention will be described.

First, during the active mode, the pull-up pre-driving unit 211 may output the pull-up data PU to the first node PUN in response to the pull-up control signal PUEN, and the pull-up main driving unit 221 may output the pull-up data PU transmitted to the first node PUN to an output terminal OUTPUT, using the first supply voltage VDD1 as a driving voltage.

Then, during the standby mode, the pull-up pre-driving unit 211 may be disabled in response to the deactivated pull-up control signal PUEN. Thus, the first node PUN may be floated. The pull-up bias control unit 231 may supply the second supply voltage VDD2 to the first node PUN in response to the pull-up second control signal OFFB, the second supply voltage VDD2 having a voltage level higher than the first supply voltage VDD1. Thus, the pull-up main driving unit 221 may reduce or prevent a leakage current because the gate voltage becomes higher than the source voltage during the standby mode.

During the standby mode, the pull-up standby bias driving unit 231 may supply the second supply voltage VDD2 to the bulk voltage node of the pull-up pre-driving unit 211, instead of the first supply voltage VDD1.

According to a pull-down operation is performed in the opposite manner to the pull-up operation, the detailed descriptions thereof are omitted herein.

During the standby mode, the bias control unit 230 may supply a higher voltage than the voltage level operated during the normal mode to the first and second nodes PUN and PDN serving as the output nodes of the pre-driving unit 210, thereby reducing or preventing a leakage current of the main driving unit 220. Furthermore, the bulk voltage of the pre-driving unit 210 may be controlled to have the same level as the voltage levels supplied to the first and second nodes PUN and PDN, thereby preventing a situation in which the transistor which has been floated and turned off is turned on.

In accordance with the embodiments of the present invention, the semiconductor device can control the voltage level applied to the bulk voltage terminal of the pre-driving unit and the gate voltage terminal of the main driving unit corresponding to the output signal of the pre-driving unit during the standby mode of the semiconductor device operating at a low voltage, thereby reducing or preventing a leakage current of the main driving unit.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
a pre-driving unit suitable for transmitting input data to a first node in response to a first control signal;
a main driving unit suitable for outputting the input data transmitted to the first node, using a first voltage as a driving voltage; and
a bias control unit suitable for supplying a second voltage to the first node in response to a second control signal, the second voltage having a different level from the first voltage,
wherein the second control signal is activated during a standby mode of the semiconductor device operating at a low voltage.

2. The semiconductor device of claim 1, wherein the pre-driving unit floats the first node when the first control signal is deactivated.

3. The semiconductor device of claim 1, wherein the bias control unit further comprises a bulk voltage control unit suitable for controlling a bulk voltage terminal of the pre-driving unit to be supplied with a third voltage in response to the second control signal, during the standby mode of the semiconductor device, the third voltage having a different level from the first voltage.

4. The semiconductor device of claim 3, wherein the second and third voltages have the same voltage level.

5. The semiconductor device of claim 3, wherein the bias control unit supplies the first voltage to the first node and the bulk voltage terminal in response to the second control signal during an active mode.

6. The semiconductor device of claim 1, wherein the first voltage comprises an external supply voltage, and the second voltage has a higher level than the external supply voltage.

7. The semiconductor device of claim 1, wherein the first voltage comprises an external ground voltage, and the second voltage has a lower level than the external ground voltage.

8. A semiconductor device comprising:
a pre-driving unit suitable for transmitting input data to first and second nodes in response to a first control signal;
a main driving unit suitable for outputting the input data transmitted to the first and second nodes, using first and second voltages as driving voltages; and
a bias control unit suitable for supplying a third voltage having a higher level than the first voltage to the first node and a first bulk voltage terminal of the pre-driving unit and for supplying a fourth voltage having a lower level than the second voltage to the second node and a second bulk voltage terminal of the pre-driving unit, respectively, in response to a second control signal.

9. The semiconductor device of claim 8, wherein the second control signal is activated during a standby mode of the semiconductor device operating at a low voltage.

10. The semiconductor device of claim 8, wherein the pre-driving unit floats the first and second nodes when the first control signal is deactivated.

11. The semiconductor device of claim 8, wherein the pre-driving unit comprises:
a pull-up pre-driving unit suitable for transmitting the input data to the first node in response to the first control signal; and
a pull-down pre-driving unit suitable for transmitting the input data to the second node in response to the first control signal.

12. The semiconductor device of claim 11, wherein the main driving unit comprises:
a pull-up main driving unit suitable for outputting the input data transmitted to the first node, using the first voltage as a driving voltage; and
a pull-down main driving unit suitable for outputting the input data transmitted to the second node, using the second voltage as a driving voltage.

13. The semiconductor device of claim 12, wherein the bias control unit comprises:
a pull-up bias control unit suitable for supplying the third voltage to the first node and the first bulk voltage terminal serving as a bulk voltage terminal of the pull-up pre-driving unit in response to the second control signal; and
a pull-down bias control unit suitable for supplying the fourth voltage to the second node and the second bulk voltage terminal serving as a bulk voltage terminal of the pull-down pre-driving unit in response to the second control signal.

14. The semiconductor device of claim 13, wherein each of the pull-up and pull-down bias control units comprises a plurality of current mirror-type MOS transistors suitable for receiving the third voltage as a supply voltage, receiving the fourth voltage as a ground voltage, and receiving a standby control signal through a common gate terminal thereof.

15. The semiconductor device of claim 13, wherein the pull-up bias control unit supplies the first voltage to the first bulk voltage terminal and the first node during an active mode.

16. The semiconductor device of claim 13, wherein the pull-down bias control unit supplies the second voltage to the second bulk voltage terminal and the second node during an active mode.

17. The semiconductor device of claim 8, wherein the first voltage comprises an external supply voltage, and the third voltage has a voltage level higher than the external supply voltage.

18. The semiconductor device of claim 8, wherein the second voltage comprises an external ground voltage, and the fourth voltage has a voltage level lower than the external ground voltage.

19. A semiconductor device, comprising:
a main driving unit suitable for outputting input data; and
a semiconductor bias controller suitable for transmitting the input data to the main driving unit during an active mode and reducing or preventing a leakage current of the main driving unit during a standby mode that the semiconductor device operates at a low voltage,
wherein the semiconductor bias controller includes:
a pre-driving unit suitable for transmitting the input data to a first node in response to a first control signal; and
a bias control unit suitable for supplying a second voltage to the first node in response to a second control signal, the second voltage having a different level from the first voltage, wherein the pre-driving unit floats the first node when the first control signal is deactivated.

* * * * *